United States Patent
Guo et al.

(10) Patent No.: US 11,199,589 B2
(45) Date of Patent: Dec. 14, 2021

(54) METHOD FOR EVALUATING CONSISTENCY OF BATTERY PACK AND STRATEGY FOR BALANCING BATTERY PACK

(71) Applicant: Tsinghua University, Beijing (CN)

(72) Inventors: Dong-Xu Guo, Beijing (CN); Xu-Ning Feng, Beijing (CN); Yue-Jiu Zheng, Beijing (CN); Xue-Bing Han, Beijing (CN); Lan-Guang Lu, Beijing (CN); Ming-Gao Ouyang, Beijing (CN); Xiang-Ming He, Beijing (CN); Geng Yang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 144 days.

(21) Appl. No.: 16/558,290

(22) Filed: Sep. 2, 2019

(65) Prior Publication Data
US 2020/0348364 A1 Nov. 5, 2020

(30) Foreign Application Priority Data
Apr. 30, 2019 (CN) .......................... 201910362597.7

(51) Int. Cl.
*G01R 31/367* (2019.01)
*G01R 31/3842* (2019.01)
(Continued)

(52) U.S. Cl.
CPC ....... *G01R 31/367* (2019.01); *G01R 31/3842* (2019.01); *H01M 10/425* (2013.01);
(Continued)

(58) Field of Classification Search
CPC .............. G01R 31/367; G01R 31/3842; G01R 31/388; G01R 31/396; G01R 31/378;
(Continued)

(56) References Cited

U.S. PATENT DOCUMENTS

| | | | |
|---|---|---|---|
| 9,897,663 B2* | 2/2018 | Hong | G01R 31/36 |
| 2013/0187610 A1* | 7/2013 | Hayashi | H02J 7/00 320/118 |
| 2017/0170669 A1* | 6/2017 | Wang | H01M 10/48 |

OTHER PUBLICATIONS

Ouyang et al., "Determination of the battery pack capacity considering the estimation error using a Capacity-Quantity diagram", Applied Energy, vol. 177, 2016, pp. 384-392, ISSN 0306-2619, Sep. 1, 2016 (Year: 2016).*

(Continued)

*Primary Examiner* — Daniel R Miller
*Assistant Examiner* — Christian T Bryant

(57) ABSTRACT

A method for evaluating a consistency of a battery pack is provided, including: obtaining an initial/real rated capacity and an initial/real dischargeable electric quantity of each cell in a battery pack after a charge and discharge cycle of the battery pack; generating a first/second data diagram for every cells based upon the initial/real rated capacity and the initial/real dischargeable electric quantity; obtaining a first/second information of key cells in the first/second data diagram, defining an initial/real cell distribution region according to the first/second information by processing the first/second data diagram, and calculating a first/second area of the initial/real cell distribution region; and evaluating the consistency of the battery pack according to the first/second area. A strategy for balancing the battery pack is further provided.

17 Claims, 8 Drawing Sheets

(51) Int. Cl.
| | |
|---|---|
| *H01M 10/42* | (2006.01) |
| *G01R 31/00* | (2006.01) |
| *G01R 31/392* | (2019.01) |
| *B60L 53/00* | (2019.01) |
| *G01R 31/378* | (2019.01) |
| *H01M 6/50* | (2006.01) |
| *B60L 58/00* | (2019.01) |
| *H01M 10/44* | (2006.01) |
| *H02J 7/00* | (2006.01) |
| *G01R 31/382* | (2019.01) |
| *H02J 3/32* | (2006.01) |
| *G01R 31/396* | (2019.01) |
| *G01R 31/388* | (2019.01) |
| *G01R 31/385* | (2019.01) |

(52) U.S. Cl.
CPC ............... *B60L 53/00* (2019.02); *B60L 58/00* (2019.02); *G01R 31/006* (2013.01); *G01R 31/378* (2019.01); *G01R 31/382* (2019.01); *G01R 31/385* (2019.01); *G01R 31/388* (2019.01); *G01R 31/392* (2019.01); *G01R 31/396* (2019.01); *H01M 6/50* (2013.01); *H01M 10/42* (2013.01); *H01M 10/4207* (2013.01); *H01M 10/44* (2013.01); *H01M 2010/4271* (2013.01); *H01M 2200/00* (2013.01); *H01M 2220/20* (2013.01); *H01M 2250/20* (2013.01); *H02J 3/322* (2020.01); *H02J 7/00* (2013.01); *Y02E 60/10* (2013.01); *Y10T 29/49108* (2015.01); *Y10T 29/53135* (2015.01)

(58) Field of Classification Search
CPC .. G01R 31/006; G01R 31/392; G01R 31/385; G01R 31/382; H01M 10/425; H01M 2010/4271; H01M 10/4207; H01M 10/42; H01M 10/44; H01M 6/50; H01M 2220/20; H01M 2250/20; H01M 2200/00; H02J 7/00; H02J 3/322; Y02E 60/10; B60L 58/00; B60L 53/00; Y10T 29/53135; Y10T 29/49108
See application file for complete search history.

(56) References Cited

OTHER PUBLICATIONS

Zheng et al., "Understanding aging mechanisms in lithium-ion battery packs: From cell capacity loss to pack capacity evolution", Journal of Power Sources, vol. 278, Mar. 15, 2015, pp. 287-295, ISSN 0378-7753 (Year: 2015).*

Zhao et al., "Analysis on Inconsistency of Electric Bicycle Battery Pack", National Active Distribution Network Technology Research Center (NANTEC), Beijing Jiaotong University, 2014 IEEE Conference and Expo Transportation Electrification Asia-Pacific (ITEC Asia-Pacific), pp. 1-5 (Year: 2014).*

* cited by examiner

METHOD FOR EVALUATING CONSISTENCY OF BATTERY PACK AND STRATEGY FOR BALANCING BATTERY PACK

CROSS-REFERENCE TO RELATED APPLICATIONS

This application claims all benefits accruing under 35 U.S.C. § 119 from Chinese Patent Application No. 201910362597.7 filed on Apr. 30, 2019 in the National Intellectual Property Administration of China, the contents of which are incorporated by reference herein.

FIELD

The present disclosure relates to battery management, and in particular to methods for evaluating consistency of battery packs and strategy for balancing battery packs.

BACKGROUND

Lithium ion cells, with lower self discharge rate, wider operating temperature range (for example, from about −25° C. to about 50° C.), no memory effect, longer cycle life, and less pollution, are favorable for electrochemical energy storage systems, such as a power supplying system of an electric vehicle. As a single cell has limited voltage and capacity, cells are assembled together to form a battery pack thereby meeting the power or energy output requirements of the electrochemical energy storage systems. However, inconsistency always exists among the cells undermining an efficiency of energy utilization of the battery pack. Therefore, it is generally required to evaluate consistency of the battery pack and balance the battery pack according to the evaluation result during the use of the battery pack.

Conventionally, the evaluation of the consistency of the battery pack is based on data of all cells in the battery pack. More specifically, a voltage profile for all cells is drawn, or a standard deviation of internal resistances of all cells is calculated, to evaluate the consistency of the battery pack. However, such an evaluation method is laborious since data of all cells are required to be detected and calculated, which results in a low efficiency.

SUMMARY

A method for evaluating a consistency of a battery pack is provided, including: obtaining an initial rated capacity and an initial dischargeable electric quantity of each cell in a battery pack after a charge and discharge cycle of the battery pack; generating a first data diagram for every cells of the battery pack based upon the initial rated capacity and the initial dischargeable electric quantity of each cell; after using the battery pack for a period of time, obtaining a real rated capacity and a real dischargeable electric quantity of each cell in the battery pack; generating a second data diagram for every cells of the battery pack based upon the real rated capacity and the real dischargeable electric quantity of each cell; obtaining a first information of key cells in the first data diagram, defining an initial cell distribution region on the first data diagram according to the first information by processing the first data diagram, and calculating a first area of the initial cell distribution region; obtaining a second information of the key cells in the second data diagram, defining a real cell distribution region on the second data diagram according to the second information by processing the second data diagram, and calculating a second area of the real cell distribution region; and evaluating the consistency of the battery pack according to the first area of the initial cell distribution region and the second area of the real cell distribution region.

A strategy for balancing a battery pack is further provided, including: obtaining an initial rated capacity and an initial dischargeable electric quantity of each cell in a battery pack after a charge and discharge cycle of the battery pack; generating a first data diagram for every cells of the battery pack based upon the initial rated capacity and the initial dischargeable electric quantity of each cell; after using the battery pack for a period of time, obtaining a real rated capacity and a real dischargeable electric quantity of each cell in the battery pack; generating a second data diagram for every cells of the battery pack based upon the real rated capacity and the real dischargeable electric quantity of each cell; obtaining a first information of key cells in the first data diagram, defining an initial cell distribution region on the first data diagram according to the first information by processing the first data diagram, and calculating a first area of the initial cell distribution region; obtaining a second information of the key cells in the second data diagram, defining a real cell distribution region on the second data diagram according to the second information by processing the second data diagram, and calculating a second area of the real cell distribution region; judging whether the second area of the real cell distribution region is consistent with the first area of the initial cell distribution region; and when the second area of the real cell distribution region is not consistent with the first area of the initial cell distribution region, balancing the battery pack until the second area of the real cell distribution region is consistent with the first area of the initial cell distribution region.

In the present disclosure, by quantifying the consistency of the battery pack with the area of the cell distribution region defined in the data diagram, it is allowed to evaluate the consistency of the battery pack intuitively. Only the area of the cell distribution region is to be calculated, thereby improving the efficiency.

BRIEF DESCRIPTION OF THE DRAWINGS

Implementations are described by way of example only with reference to the attached figures.

DETAILED DESCRIPTION

A detailed description with the above drawings is made to further illustrate the present disclosure.

A method for evaluating a consistency of a battery pack and a strategy for balancing the battery pack are provided in the present disclosure. The method and/or the strategy can be applied to a variety of fields and scenes, for example, to a battery pack, such as a lithium ion battery pack. The method and/or the strategy can be executed by a variety of execution components or devices, such as a battery testing device or a processor in the battery testing device.

Figure 1:
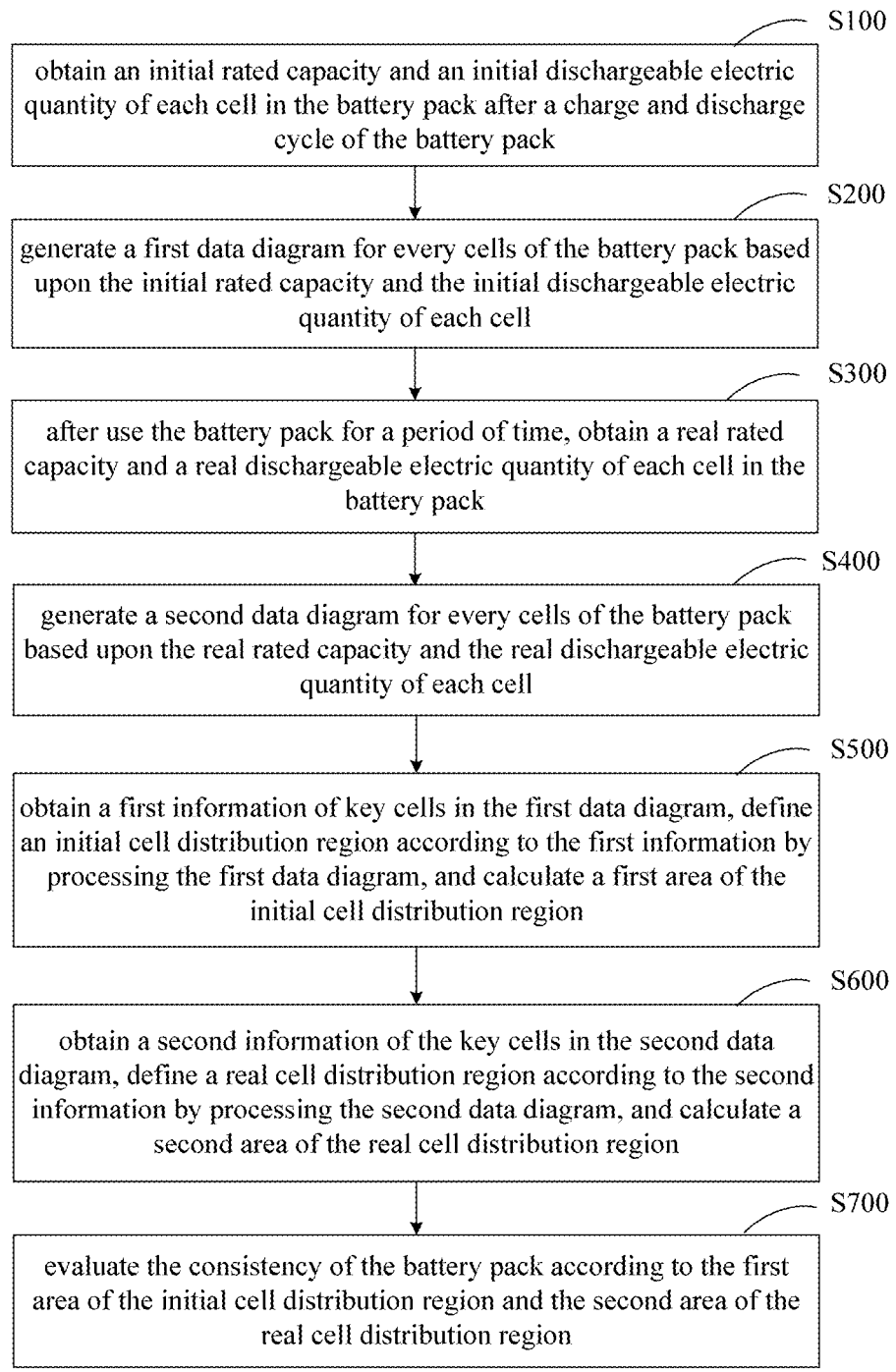
FIG. 1 shows a flowchart of an embodiment of a method for evaluating a consistency of a battery pack.

Referring to FIG. 1, an embodiment of the method for evaluating the consistency of the battery pack includes:

S100, obtaining an initial rated capacity and an initial dischargeable electric quantity of each cell in the battery pack after a charge and discharge cycle of the battery pack;

S200, generating a first data diagram for every cells of the battery pack based upon the initial rated capacity and the initial dischargeable electric quantity of each cell;

S300, after use the battery pack for a period of time, obtaining a real rated capacity and a real dischargeable electric quantity of each cell in the battery pack;

S400, generating a second data diagram for every cells of the battery pack based upon the real rated capacity and the real dischargeable electric quantity of each cell;

S500, obtaining a first information of key cells in the first data diagram, defining an initial cell distribution region on the first data diagram according to the first information by processing the first data diagram, and calculating a first area of the initial cell distribution region;

S600, obtaining a second information of the key cells in the second data diagram, defining a real cell distribution region on the second data diagram according to the second information by processing the second data diagram, and calculating a second area of the real cell distribution region; and S700, evaluating the consistency of the battery pack according to the first area of the initial cell distribution region and the second area of the real cell distribution region.

In the S100, the battery pack can include a plurality of cells connected in series. At least two (for example, ten) cells can be provided in the battery pack. In an embodiment, the cells can be lithium ion cells. In an embodiment, the cells can be unused cells. In an embodiment, the battery pack can have never been used after leaving the factory. Each cell can have its own initial rated capacity (or nameplate capacity) and its own initial dischargeable electric quantity.

In the S200, the first data diagram can be a table or a graph. In an embodiment, the data diagram is a 2D graph based on a rectangular coordinate system, with the initial rated capacity as its x-axis and the initial dischargeable electric quantity as its y-axis. A coordinate point defined by the initial rated capacity and the initial dischargeable electric quantity of each cell can be drawn as a scattered dot in the graph.

Figure 2:
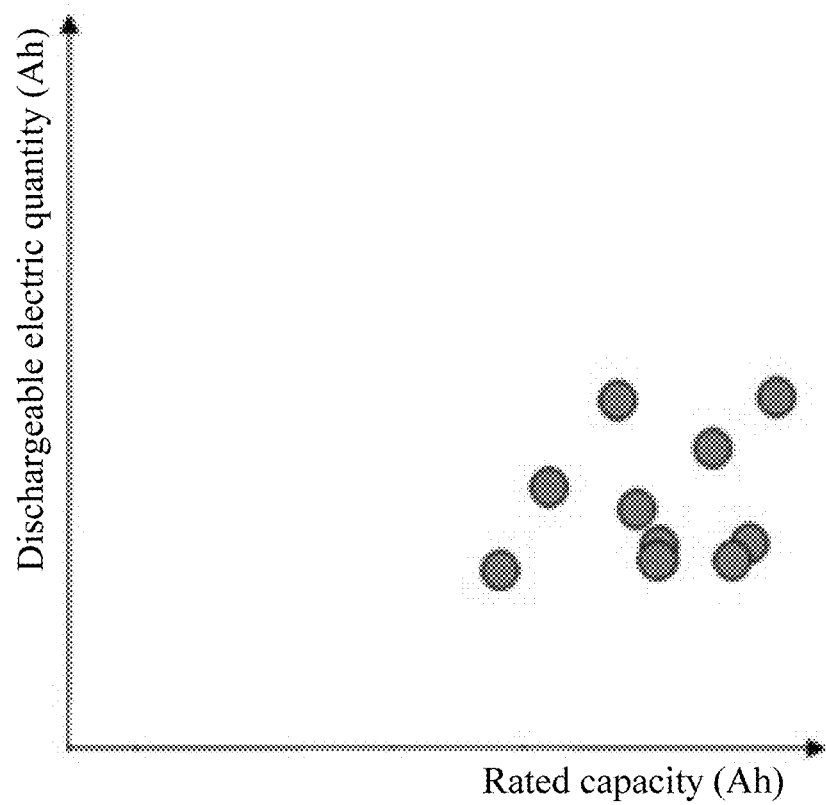
FIG. 2 shows a schematic first data diagram generated by an embodiment of the method for evaluating the consistency of the battery pack.

FIG. 2 shows a schematic first data diagram generated by an embodiment of the present disclosure, in which each coordinate point represents one cell. An x-axis value of the coordinate point represents the initial rated capacity of the cell, and a y-axis value of the coordinate point represents the initial dischargeable electric quantity of the cell.

In the S300, the period of time can be a service time of the battery pack in a practical application (for example, in an electric car). The period of time can be a preset value, and can be such as days, months, or years. A performance and data of each cell may be changed with the use of the battery pack, so it is necessary to obtain the real rated capacity and the real dischargeable electric quantity of each cell to obtain a real-time status of each cell in the battery pack.

In the S400, the first data diagram is updated to reflect the real-time status of each cell in the battery pack. The second data diagram is the updated first data diagram. The first data diagram reflecting the initial status of each cell and the second data diagram reflecting the real-time status of each cell provide a basis for evaluating the consistency of the battery pack.

The second data diagram can be a table or a graph. In an embodiment, the second data diagram is a 2D graph based on a rectangular coordinate system, with the real rated capacity as its x-axis and the real dischargeable electric quantity as its y-axis. A coordinate point defined by the real rated capacity and the real dischargeable electric quantity of each cell can be drawn as a scattered dot in the graph.

Figure 3:
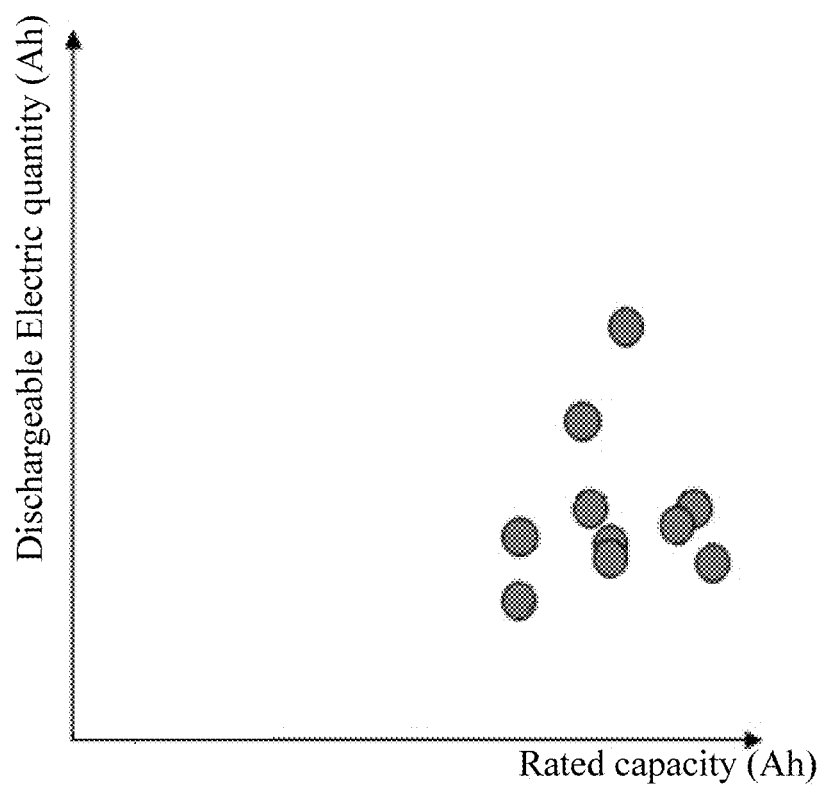
FIG. 3 shows a schematic second data diagram generated by an embodiment of the method for evaluating the consistency of the battery pack.

Referring to FIG. 3 which shows a schematic second data diagram generated by the method of an embodiment of the present disclosure, it can be seen that locations of coordinate points of the cells are changed compared to the FIG. 2 after using the period of time, reflecting the real-time status of each cell.

In the S500, although the battery pack includes a plurality of cells, the current states of the capacity and the electric quantity of the battery pack are usually determined by only a few cells but not all cells in the battery pack after the initial cycling. The few cells are defined as key cells in the battery pack herein. The first information of the key cells in the first data diagram can refer to location information of coordinate points of the key cells in the first data diagram. The initial cell distribution region can be restricted by locations of the coordinate points of the key cells in the first data diagram. The first distribution region can reflect the states of the capacity and the electric quantity of the battery pack after the initial cycling.

In the S600, after using the battery pack for the period of time, the locations of the coordinate points of the key cells in the data diagram are changed. The second information of the key cells in the second data diagram can refer to location information of coordinate points of the key cells in the second data diagram. The real cell distribution region can be restricted by locations of the coordinate points of the key cells in the second data diagram. The second distribution region can reflect the real-time states of the capacity and the electric quantity of the battery pack after using the period of time.

In the S500 and the S600, the shapes of the initial cell distribution region and the real cell distribution region can be determined according to the locations of the coordinate points of the key cells. The shapes may each be a triangle, a circle, a square, a rectangle, a trapezoid, any combination thereof, or other polygons. The first area and the second area can be calculated according to the shapes thereof, respectively.

In the S700, it should be understood that the larger an area of a cell distribution region in a data diagram, the worse the consistency of the battery pack, and vice versa. For example, if all cells in the battery pack are completely consistent, then the locations of the coordinate points of all cells in the data diagram should be the same, and an area of the cell distribution region would be zero.

By quantifying the consistency of the battery pack with the area of the cell distribution region defined in the data diagram, it is allowed to evaluate the consistency of the battery pack intuitively. Only the area of the cell distribution region is to be calculated, thereby improving the efficiency and simplifying the evaluation.

In an embodiment, the S100 can include:

S110, obtaining initial data of each cell in the battery pack during the charge and discharge cycle of the battery pack; and S120, calculating the initial rated capacity and the initial dischargeable electric quantity of each cell based upon the initial data obtained.

In the S110, each cell can be electrically connected to one sensor. The sensor can be configured to real-timely collect the cell data during cycling of the battery pack. The cell data collected can then be transmitted to a processor after the cycling of the battery pack.

In an embodiment, the S110 can include:

S111, collecting charging time data and discharging time data of each cell during one charge and discharge cycle of the battery pack.

The data of each cell can include the charging time data and the discharging time data in one charge and discharge cycle of the battery pack. The charging time data of each cell can be collected by the corresponding sensor during charging. The discharging time data of each cell can be collected by the corresponding sensor during discharging. The charging time data and the discharging time data of each cell can be configured to reflect the status of each cell so as to provide basis for generating the first data diagram.

In an embodiment, the S111 can include:

S1112, charging the battery pack with a constant charge current $I^C$ from a zero time point, and recording a time point $T_i^C$ when a terminal voltage of each cell reaches to a voltage limit for charge (VLC) until terminal voltages of all cells reach to the VLC, wherein i corresponding to a reference number for each cell (for example, i can be a positive integer), and recording an earliest time point $T_i^C$ as $T_{min}^C$;

S1114, after terminal voltages of all cells reach to the VLC, terminating the charge and resting the battery pack for a preset time period; and S1116, after the preset time period, discharging the battery pack with a constant discharge current $I^D$, and recording a time point $T_i^D$ when the terminal voltage of each cell reaches to a voltage limit for discharge (VLD) until terminal voltages of all cells reach to the VLD, and recording an earliest time point $T_i^D$ as $T_{min}^D$.

A VLC for one cell refers to a voltage at which this cell reaches a full-charge state. A VLD for one cell refers to a voltage at which this cell reaches the full-discharge state. The cells in one battery pack usually have different voltages at a same charge/discharge time point due to the cell variations. During charging, when a terminal voltage of a cell having a highest real-time voltage ($cell_{max\ V}$) reaches its VLC, if the battery pack is continually charged, then the $cell_{max\ V}$ that has been already fully charged will be over charged, which may cause an overheating and degradation of the cell. Thus, a full-charge state of the battery pack generally is the full-charge state of the $cell_{max\ V}$. The $T_{min}^C$ refers to the time point when the terminal voltage of the $cell_{max\ V}$ reaches the VLC and is the moment when the battery pack reaches the full-charge state. During the remaining charging after the $T_{min}^C$, the battery pack is in an over-charge state. The terminal voltage of one cell is increasing along with the charging even if this cell has been fully charged, therefore, when the terminal voltage of a cell having the lowest real-time voltage ($cell_{min\ V}$) in the battery pack reaches the VLC, the terminal voltages of other cells has exceeded the VLC and their values are different as originally exhibited.

Correspondingly, during discharging, when the terminal voltage of $cell_{min\ V}$ reaches its VLD, if the battery pack is continually discharged, then the $cell_{min\ V}$ that has been already fully discharged will be over discharged, which may cause a reduced longevity of the cell. Thus, a full-discharge state of the battery pack generally is the full-discharge state of the $cell_{min\ V}$. The $T_{min}^D$ refers to the time point when the terminal voltage of the $cell_{min\ V}$ reaches the VLD and is the moment when the battery pack reaches the full-discharge state. During the remaining discharging after the $T_{min}^D$, the battery pack is in an over-discharge state. The terminal voltage of one cell is decreasing along with the discharging even if this cell has been fully discharged, therefore, when the terminal voltage of $cell_{max\ V}$ reaches the VLD, the terminal voltages of other cells has exceeded the VLD and their values are different as originally exhibited.

In the present embodiment, the data of cells are collected during charging and discharging the battery pack slightly over. Because the cell variances are unusually small in the battery pack, charging or discharging the cell slightly over just one or a few times has little influence on the cell degradation and longevity.

It should be noted that the time points when the terminal voltages of the cells in the battery pack reaches the VLC or VLD are generally different due to the cell variations. The $T_i^C$ and the $T_i^D$ can reflect the state of each cell. The $T_{min}^C$ and the $T_{min}^D$ can reflect the state of the battery pack. The battery pack is sequentially subjected to charge, over charge, resting, discharge, and over discharge to collect the charging time data and discharging time data of each cell, which provides basis for generating the data diagram.

The terminal voltage of each cell refers to a voltage at one of two terminals of respective cell. The terminal voltage of each cell can be detected by the sensor of respective cell. The $I^C$, $I^D$, VLC, and VLD can be predetermined. In an embodiment, the $I^C$ can be in a range from about ⅓ C (charge rate) to about 1 C. In one embodiment, the $I^D$ can be in a range from about ⅓ C to about 1 C. In an embodiment, $I^C$ is equal to $I^D$. In an embodiment, the $I^C$ and the $I^D$ can both be ⅓ C, the $V_{lim}^C$ can be 4.2 V, and the $V_{lim}^D$ can be 2.75 V.

Resting the battery pack means that the battery pack is neither charged nor discharged and the current flow either from (discharge) or to (charge) the battery pack may be negligible. The battery pack will become gradually stable during resting, which is favorable for obtaining accurate data in the subsequent discharge. The pre-set time period can be any suitable time period, for example, about 1 hour or above 1 hour.

In an embodiment, the S120 can include:

S121, calculating the initial rated capacity $Q_i$ of each cell according to the following equation I:

$$Q_i = \int_{T_i^C}^{T_i^D} I_D \, dt \qquad\qquad\qquad\qquad \text{I}$$

S122, calculating an initial chargeable electric quantity difference $E_i^C$ of each cell according to the following equation II:

$$E_i^C = \int_{T_{min}^C}^{T_i^C} I^C \, dt \qquad\qquad\qquad\qquad \text{II; and}$$

S123, calculating the initial dischargeable electric quantity $E_i^D$ of each cell according to the following equation III:

$$E_i^D = Q_i - E_i^C \qquad\qquad\qquad\qquad \text{III}$$

When the battery pack is in the full-charge state, most of the cells have not been fully charged at that moment yet. The chargeable electric quantity difference $E_i^C$ of one cell refers to an electric quantity charged from the time point when the battery pack reaches the full-charge state (i.e. $T_{min}^C$) to the time point when this cell reaches the full-charge state (i.e. $T_i^C$). The dischargeable electric quantity $E_i^D$ of one cell refers to a dischargeable electric quantity of this cell when the battery pack reaches the full-charge state.

In the present embodiment, the initial rated capacity and the initial dischargeable electric quantity of each cell are calculated according to the collected charging time data and discharging time data so as to determine the corresponding relationship between the rated capacity and the dischargeable electric quantity of each cell and generate the first data diagram.

In an embodiment, the S300 can include:

S310, after use the battery pack for the period of time, obtaining an open circuit voltage of each cell in the battery pack;

S320, obtaining a state of charge $SOC_i$ of each cell based upon the open circuit voltage obtained;

S330, obtaining the initial rated capacity $Q_i$ of each cell from the first data diagram and using the initial rated capacity $Q_i$ as the real rated capacity of each cell; and S340, calculating the real dischargeable electric quantity $E_i^R$ of each cell based upon the state of charge $SOC_i$ and the real rated capacity of each cell according to the following equation IV:

$$E_i^R = Q_i \times SOC_i \quad \text{IV.}$$

In an embodiment of the S310, the open circuit voltage of each cell can be obtained by measuring a terminal voltage of each cell immediately after the battery pack has been rested for at least 1 hour. A terminal voltage of a cell is substantially the same as an open circuit voltage of the cell when the cell is in a stable state. Since the battery pack will become gradually stable during resting, the open circuit voltage of each cell can be obtained by measuring the terminal voltage of each cell after a long time resting.

In the S320, the state of charge $SOC_i$ of each cell can be obtained by querying from a user manual provided by a cell manufacturer according to the open circuit voltage obtained. A relationship of the state of charge and the open circuit voltage of the cell is generally recorded in the user manual.

In the S330, since the rated capacity of a cell is substantially constant during the lifetime of the cell, the initial rated capacity $Q_i$ of each cell used to generate the first data diagram can also be used to generate the second data diagram.

In the S340, the real dischargeable electric quantity $E_i^R$ of each cell can be calculated based upon the $SOC_i$ of each cell. It should be noted that the real dischargeable electric quantity $E_i^R$ of each cell can also be obtained by other ways.

In an embodiment, the S500 can include:

S510, determining first locations of coordinate points of a cell with a lowest initial chargeable electric quantity, a cell with a lowest initial dischargeable electric quantity, a cell with a lowest initial rated capacity, and a cell with a highest initial rated capacity in the first data diagram; and S520, drawing first boundary lines on the first data diagram based upon the first locations to define the initial cell distribution region.

The cell with the lowest initial chargeable electric quantity, the cell with the lowest initial dischargeable electric quantity, the cell with the lowest initial rated capacity, and the cell with the highest initial rated capacity are the key cells.

Figure 4:
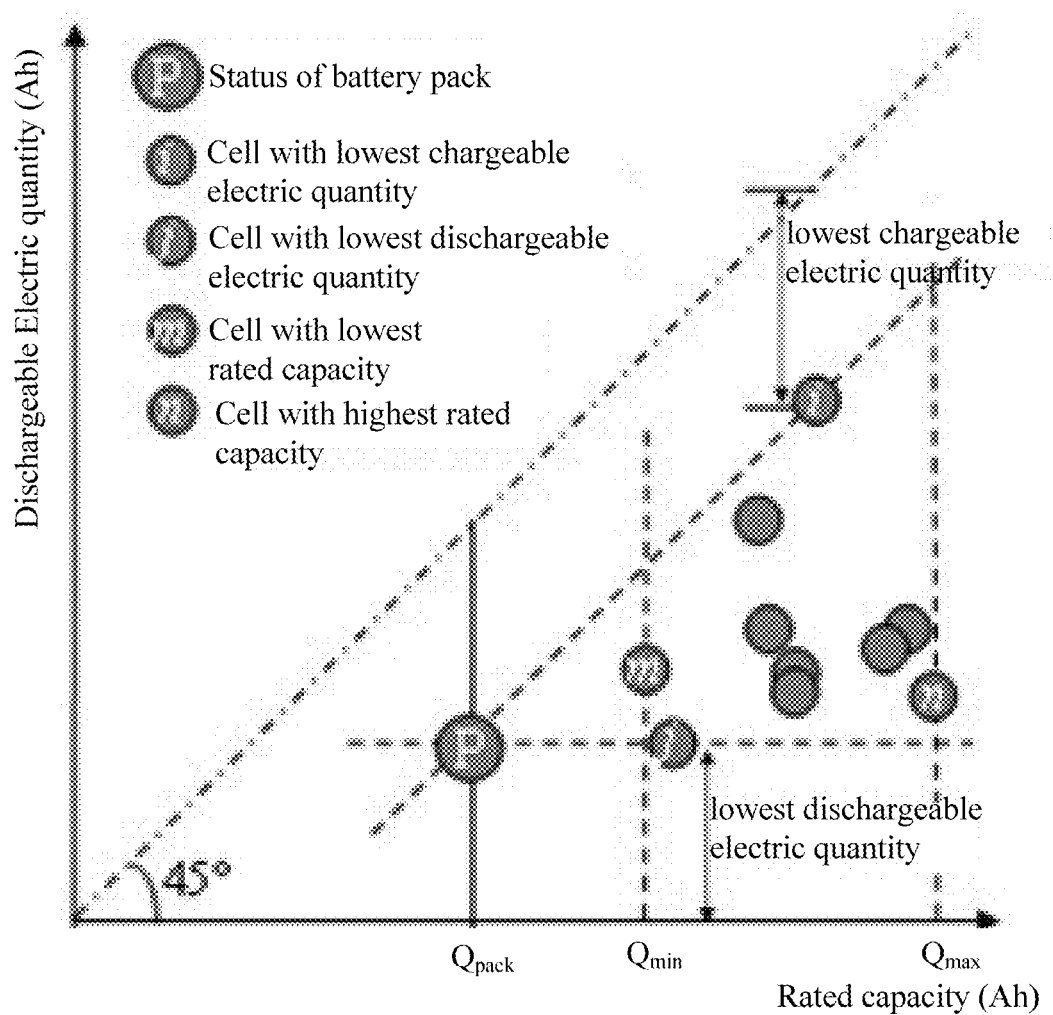
FIG. 4 shows a schematic data diagram defining a cell distribution region.

As shown in FIG. 4 illustrating a schematic first data diagram in which an initial cell distribution region is defined, the coordinate points of the other cells are surrounded by the coordinate points of the key cells in the battery pack, and the initial cell distribution region restricted by the coordinate points of the key cells can reflect the states of the initial capacity and the initial electric quantity of the battery pack.

In an embodiment, the S600 can include:

S610, determining second locations of coordinate points of a cell with a lowest real chargeable electric quantity, a cell with a lowest real dischargeable electric quantity, a cell with a lowest real rated capacity, and a cell with a highest real rated capacity in the second data diagram; and S620, drawing second boundary lines on the second data diagram based upon the second locations to define the real cell distribution region.

The cell with the lowest real chargeable electric quantity, the cell with the lowest real dischargeable electric quantity, the cell with the lowest real rated capacity, and the cell with the highest real rated capacity are the key cells. The real cell distribution region restricted by the coordinate points of the key cells can reflect the states of the real capacity and the real electric quantity of the battery pack.

In an embodiment, the first boundary lines and the second bound lines can each include a lowest rated capacity line, a highest rated capacity line, a charge isoline, and a discharge isoline. The lowest rated capacity line passes the coordinate point of the cell with the lowest rated capacity and is perpendicular to the x-axis of the data diagram. The highest rated capacity line passes the coordinate point of the cell with the highest rated capacity and is perpendicular to the x-axis of the data diagram. The discharge isoline passes the coordinate point of the cell with the lowest dischargeable electric quantity and is in parallel with the x-axis of the data diagram. The charge isoline passes the coordinate point of the cell with the lowest chargeable electric quantity and has about a 45° intersection angle with the x-axis of the data diagram.

The initial cell distribution region can be defined by the lowest rated capacity line, the highest rated capacity line, the charge isoline, and the discharge isoline in the first data diagram. The real cell distribution region can be defined by the lowest rated capacity line, the highest rated capacity line, the charge isoline, and the discharge isoline in the second data diagram. Referring to FIG. 4 again, it can be seen the coordinate points of all cells can be located within the cell distribution region defined by the four boundary lines. The cell distribution region defined by the four boundary lines can reflect the states of the capacity and the electric quantity of the battery pack.

In an embodiment, the initial cell distribution region can be enclosed by the lowest rated capacity line, the highest rated capacity line, the charge isoline, and the discharge isoline in the first data diagram. The real cell distribution region can be enclosed by the lowest rated capacity line, the highest rated capacity line, the charge isoline, and the discharge isoline in the second data diagram. The coordinate points of all cells in the first data diagram or the second diagram can be located within the initial cell distribution region or the real cell distribution region.

The initial cell distribution region and the real cell distribution region defined by the four boundary lines usually each have a shape of trapezoid. The initial cell distribution region and the real cell distribution region can also have other shapes based on manners to define them.

In an embodiment, the S500 can further include:

S530, obtaining an highest initial rated capacity $Q_{max}$ among the cells in the battery pack, a lowest initial rated capacity $Q_{min}$ among the cells in the battery pack, and an initial rated capacity $Q_{pack}$ of the battery pack; and S540, calculating the first area of the initial cell distribution region according to an equation VI:

$$S = \frac{(Q_{max} + Q_{min} - 2 \times Q_{pack}) \times (Q_{max} - Q_{min})}{2} \qquad \text{VI}$$

wherein S denotes the first area of the initial cell distribution region.

The initial highest rated capacity $Q_{max}$ and the initial lowest rated capacity $Q_{min}$ can be obtained by comparing the initial rated capacity of each cell obtained in the S100. The initial rated capacity $Q_{pack}$ of the battery pack can be calculated according to an equation VII:

$$Q_{pack} = (T_{min}^D - T_0) \times I_D \qquad \text{VII}$$

wherein $T_0$ denotes a time point of beginning to discharge the battery pack, $T_{min}^D$ denotes the time point of the battery pack reaching the full discharge state, and $I_D$ refers to the discharge current.

The initial rated capacity $Q_{pack}$ of the battery pack refers to an electric quantity discharged from $T_0$ to $T_{min}^D$. As described above, $T_{min}^D$ also denotes the time point of the terminal voltage of $cell_{max\_V}$ reaching the voltage limit for discharge.

In another embodiment, since a coordinate point where the charge isoline and the discharge isoline are intersected reflects the status of the battery pack, the initial $Q_{pack}$ can be obtained directly from the first data diagram. That is, the initial $Q_{pack}$ is equal to an x-axis value of an intersection of the charge isoline and the discharge isoline in the first data diagram.

The equation VI is established based on a general equation for calculating an area of a trapezoid. Referring to FIG. 4, since the charge isoline has about a 45° intersection angle with the discharge line, and the intersection of the charge isoline and the discharge isoline reflects the status of the battery pack, a length of a shorter parallel side of the trapezoid can be equal to a difference between the $Q_{min}$ and the $Q_{pack}$. A length of a longer parallel side of the trapezoid can be equal to a difference between the $Q_{max}$ and the $Q_{pack}$. A height (a perpendicular distance between the two parallel sides) of the trapezoid can be equal to a difference between the $Q_{max}$ and the $Q_{pack}$. Consequently, the equation VII is obtained by introducing the two lengths and the height into the general equation for calculating an area of a trapezoid.

In an embodiment, the S600 can further include:

S630, obtaining a highest real rated capacity $Q'_{max}$ among the cells in the battery pack, a lowest real rated capacity $Q'_{min}$ among the cells in the battery pack, and a real rated capacity $Q'_{pack}$ of the battery pack.

S640, calculating the second area of the real cell distribution region according to an equation VIII:

$$S' = \frac{(Q'_{max} + Q'_{min} - 2 \times Q'_{pack}) \times (Q'_{max} - Q'_{min})}{2} \qquad \text{VIII}$$

wherein S' denotes the second area of the real cell distribution region.

The S630 and the S640 are substantially the same as the S530 and the S540, respectively, and will not be repeated again.

In one embodiment, the S700 can include:

S710, judging whether the first area of the initial cell distribution region is consistent with the second area of the real cell distribution region;

S720, determining that the consistency of the battery pack is good if the first area of the initial cell distribution region is consistent with the second area of the real cell distribution region; and S730, determining the consistency of the battery pack is poor if the first area of the initial cell distribution region is not consistent with the second area of the real cell distribution region.

Figure 5:
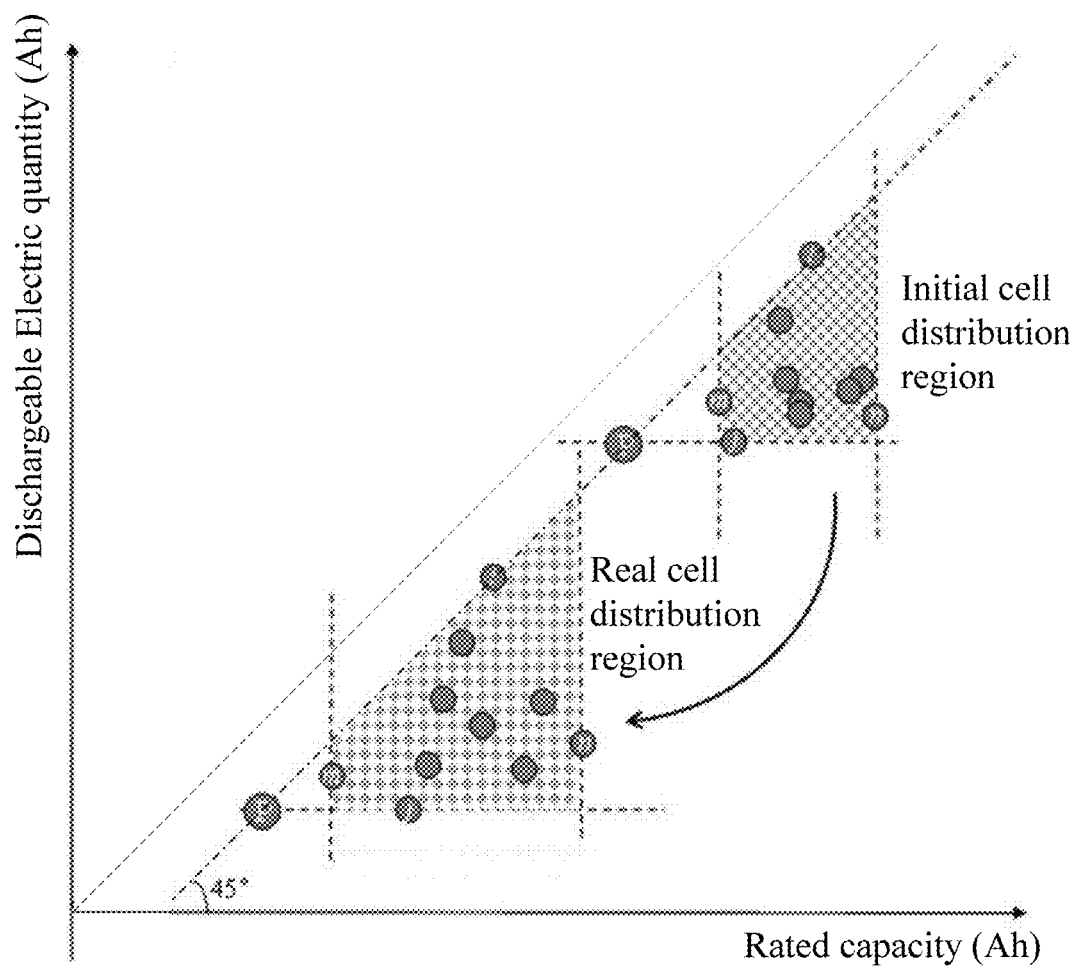
FIG. 5 shows a schematic data diagram comparing an initial cell distribution region with a real cell distribution region.

It should be understood that the larger the area of the cell distribution region in the data diagram, the worse the consistence of the battery pack, and vice versa. A battery pack which has never been used after leaving the factory usually have good consistency, however, the consistency is getting poor with the aging of the battery pack. Therefore, the change of the consistency of the batter pack can be determined by comparing the first area of the initial cell distribution region with the second area of the real cell distribution region. If the first area of the initial cell distribution region is consistent with the second area of the real cell distribution region, then the consistency of the batter pack is not changed. If the second area of the real cell distribution region is not consistent with the first area of the initial cell distribution region, such as larger than the first area, then the consistency of the batter pack is worse, as shown in FIG. 5. The data diagram defines a new intuitive index (i.e. the area of the cell distribution region) for evaluating the consistency of the battery pack.

In an embodiment, the S710 can include:

S711, calculating a real difference between the first area of the initial cell distribution region and the second area of the real cell distribution region;

S712, comparing the real difference with a preset difference threshold value between the first area and the second area;

S713, determining that the first area is consistent with the second area if the real difference is smaller than the preset difference threshold value; and S714, determining that the first area is not consistent with the second area if the real difference is larger than the preset difference threshold value.

Since the consistency of the battery pack is usually getting poor with the aging of the battery pack, an acceptable range of a consistency variation can be preset to evaluate the consistency of the battery pack. The preset difference threshold value defines the acceptable range of the consistency variation and can be predetermined according to needs. If the real difference is smaller than the preset difference threshold value, then the consistency variation is within the acceptable range and it can be determined that the consistency of the battery pack is still good. If the real difference is larger than the preset difference threshold value, then the consistency variation is out of the acceptable range and it can be determined that the consistency of the battery pack has been poor. By judging whether the consistency variation is within the acceptable range to evaluate the consistency of the battery pack, the method can be more practical for users.

Figure 6:
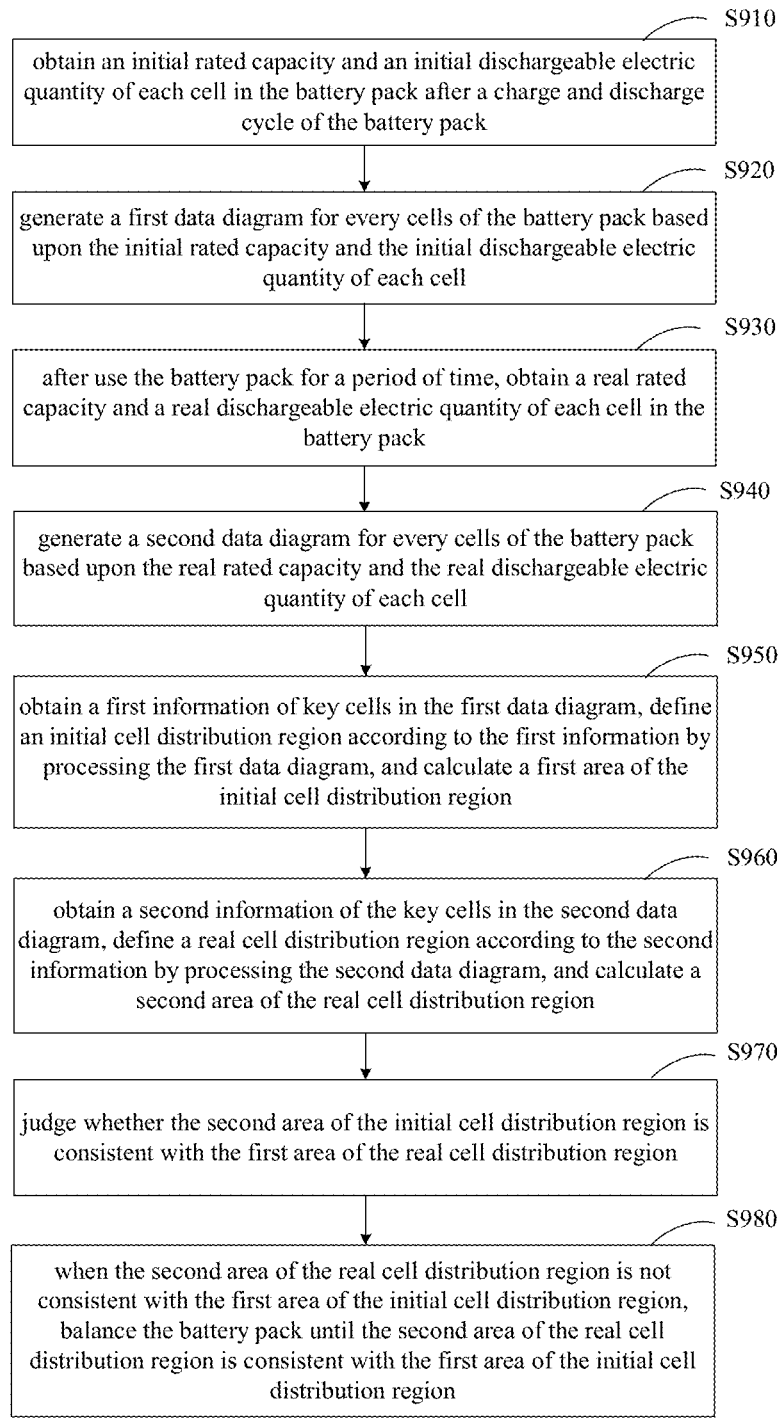
FIG. 6 shows a flowchart of an embodiment of a strategy for balancing a battery pack.

Referring to FIG. 6, an embodiment of a strategy for balancing a battery pack, includes:

S910, obtaining an initial rated capacity and an initial dischargeable electric quantity of each cell in the battery pack after a charge and discharge cycle of the battery pack;

S920, generating a first data diagram for every cells of the battery pack based upon the initial rated capacity and the initial dischargeable electric quantity of each cell;

S930, after using the battery pack for a period of time, obtaining a real rated capacity and a real dischargeable electric quantity of each cell in the battery pack;

S940, generating a second data diagram for every cells of the battery pack based upon the real rated capacity and the real dischargeable electric quantity of each cell;

S950, obtaining a first information of key cells in the first data diagram, defining an initial cell distribution region on the first data diagram according to the first information by processing the first data diagram, and calculating a first area of the initial cell distribution region;

S960, obtaining a second information of key cells in the second data diagram, defining a real cell distribution region on the second data diagram according to the second information by processing the second data diagram, and calculating a second area of the real cell distribution region;

S970, judging whether the second area of the initial cell distribution region is consistent with the first area of the real cell distribution region; and S980, when the second area of the real cell distribution region is not consistent with the first area of the initial cell distribution region, balancing the battery pack until the second area of the real cell distribution region is consistent with the first area of the initial cell distribution region.

The S910, S920, S930, S940, S950, S960, and S970 are substantially the same as the S100, S200, S300, S400, S500, S600, and S710 respectively, and will not repeated again.

In the S980, the balancing can be an active balancing and/or a passive balancing. In the active balancing, the energy, for example, the electric quantity, is drawn from higher electric quantity cells and transferred to lower electric quantity cells. In the passive balancing, the energy, for example, the electric quantity, is drawn from higher electric quantity cells and dissipated as heat, usually through resistors until the voltage or charge matches the voltage on the lower electric quantity cell.

In an embodiment, the S980 can include:

S981, determining a target cell for balancing;

S982, drawing a balancing target line in the second data diagram based upon the target cell to generate a strategy diagram; and S983, defining a region to be balanced by the balancing target line in the strategy diagram and balancing the battery pack until the coordinate point of each cell within the region to be balanced reaches the balancing line.

In an ideal situation, the state of each cell can be substantially the same as that of the target cell after balancing. In an ideal situation, the coordinate point corresponding to each cell should be located on the balancing target line after balancing.

The target cell can be an imaginary cell. In the active balancing, the target cell can have a rated capacity equal to an average of rated capacities of all cells in the battery pack. The target cell can also have a dischargeable electric quantity equal to an average of dischargeable electric quantities of all cells in the battery pack.

Figure 7:
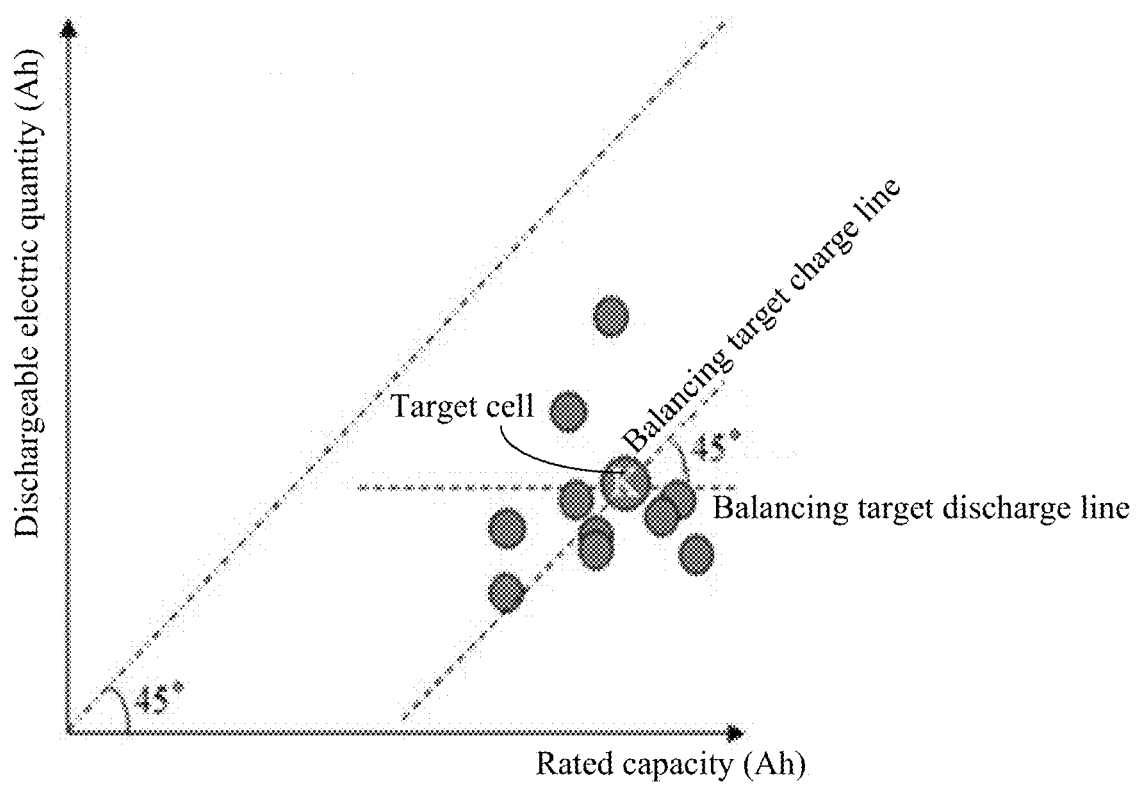
FIG. 7 shows a strategy diagram for active balancing provided by an embodiment of strategy for balancing the battery pack.

In the active balancing, the balancing target line can include a balancing target charge line and a balancing target discharge line. During charging, in an ideal situation, all the cells are expected to be fully charged (in the full charge state, and the dischargeable electric quantity of one cell is expected to be equal to the rated capacity of this cell) together, therefore, referring to FIG. 7, the balancing target charge line can have about a 45° intersection angle with the x-axis and pass a coordinate point of the target cell. Similarly, during discharging, in an ideal situation, all the cells are expected to be fully discharged, therefore, referring to FIG. 7, the balancing target discharge line can be in parallel with the x-axis and pass the coordinate point of the target cell.

In the passive balancing, the target cell can have a rated capacity equal to a lowest rated capacity among the cells in the battery pack. The target cell can further have a discharge electric quantity equal to a lowest discharge electric quantity among the cells in the battery pack to achieve the maximum usage of the pack capacity.

Figure 8:
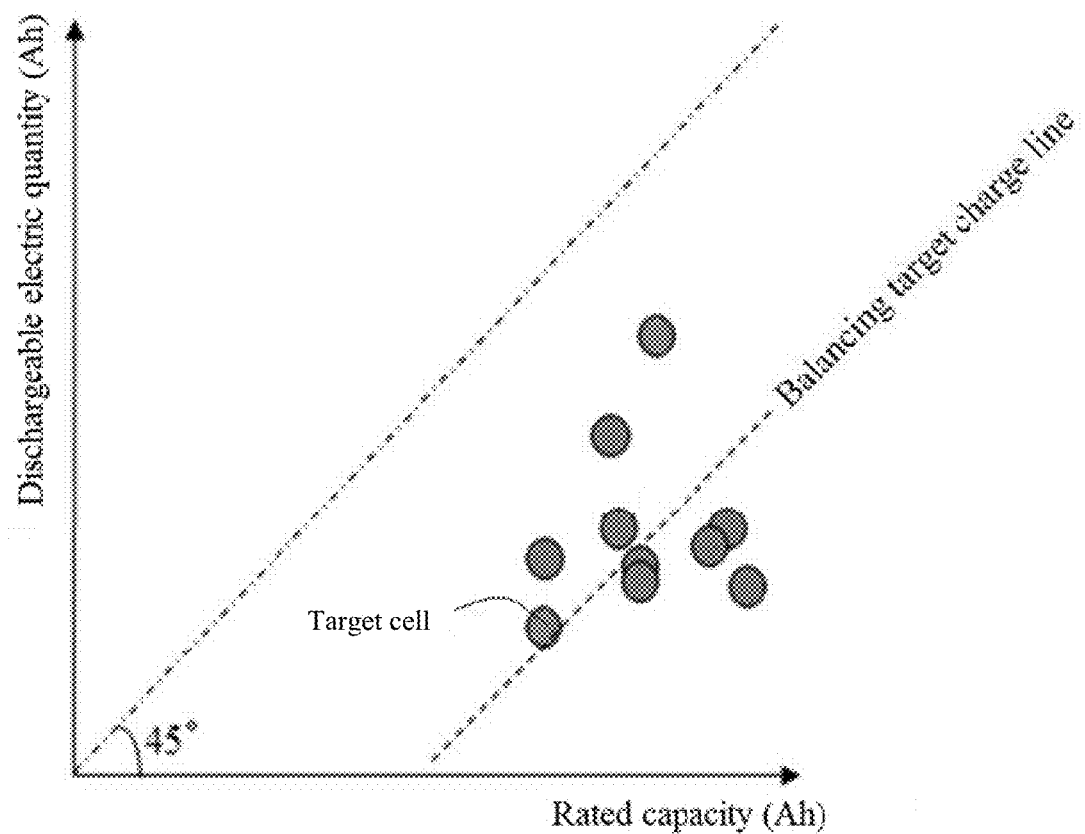
FIG. 8 shows a strategy diagram for passive balancing provided by an embodiment of strategy for balancing the battery pack.

In the passive balancing, the balancing line can include a balancing target charge line. Referring to FIG. 8, the balancing target charge line can have about a 45° intersection angle with the x-axis and pass a dot corresponding to the target cell.

For the active balancing, the coordinate point of each cell can be moved up and down. The 983 can include:

defining a region located above the balancing target line as a discharge region and defining a region located below the balancing target line as a charge region; and transferring energy from the cell located within the discharge region to the cell located within the charge region until the coordinate point of each cell in the battery pack reaches the balancing line.

For the passive balancing, the coordinate point of each cell can be only moved down. The S983 can include:

defining a region located above the balancing target line as a discharge region; and discharging the cell located within the discharge region until the coordinate point of each cell within the discharge region reaches the balancing line.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A method for evaluating a consistency of a battery pack, comprises:

obtaining an initial rated capacity and an initial dischargeable electric quantity of each cell in a battery pack after a charge and discharge cycle of the battery pack;

generating a first data diagram for every cells of the battery pack based upon the initial rated capacity and the initial dischargeable electric quantity of each cell;

after using the battery pack for a period of time, obtaining a real rated capacity and a real dischargeable electric quantity of each cell in the battery pack;

generating a second data diagram for every cells of the battery pack based upon the real rated capacity and the real dischargeable electric quantity of each cell;

obtaining a first information of key cells in the first data diagram;

defining an initial cell distribution region on the first data diagram according to the first information by processing the first data diagram;

calculating a first area of the initial cell distribution region;

obtaining a second information of the key cells in the second data diagram;

defining a real cell distribution region on the second data diagram according to the second information by processing the second data diagram;
calculating a second area of the real cell distribution region; and
evaluating the consistency of the battery pack according to the first area of the initial cell distribution region and the second area of the real cell distribution region;
wherein the evaluating the consistency of the battery pack comprises:
judging whether the second area of the real cell distribution region is consistent with the first area of the initial cell distribution region;
determining that the consistency of the battery pack is good if the second area of the real cell distribution region is consistent with the first area of the initial cell distribution region; and
determining that the consistency of the battery pack is poor if the second area of the real cell distribution region is not consistent with the first area of the initial cell distribution region;
wherein the judging whether the second area of the real cell distribution region is consistent with the first area of the initial cell distribution region comprises:
calculating a real difference between the second area of the real cell distribution region and the first area of the initial cell distribution region;
comparing the real difference with a preset difference threshold value between the second area of the real cell distribution region and the first area of the initial cell distribution region;
determining that the second area of the real cell distribution region is consistent with the first area of the initial cell distribution region if the real difference is equal to or smaller than the preset difference threshold value; and
determining that the second area of the real cell distribution region is not consistent with the first area of the initial cell distribution region if the real difference is larger than the preset difference threshold value.

2. The method of claim 1, wherein the obtaining an initial rated capacity and an initial dischargeable electric quantity of each cell in the battery pack comprises:
charging the battery pack with a constant charge current $I^C$ from a zero time point;
recording a time point $T_i^C$ when a terminal voltage of each cell reaches a voltage limit for charge until terminal voltages of all cells reach the voltage limit for charge, wherein i denotes a reference number for each cell;
recording an earliest time point $T_i^C$ as $T_{min}^C$;
after terminal voltages of all cells reach to the voltage limit for charge, resting the battery pack for a preset time period;
after the preset time period, discharging the battery pack with a constant discharge current $I^D$, recording a time point $T_i^D$ when the terminal voltage of each cell reaches to a voltage limit for discharge until terminal voltages of all cells reach to the voltage limit for discharge, and recording an earliest time point $T_i^D$ as $T_{min}^D$;
calculating the initial rated capacity of each cell by an equation I:

$$Q_i = \int_{T_i^C}^{T_i^D} I^D dt \quad \text{I}$$

wherein Qi denotes the rated capacity of each cell; and
calculating the initial dischargeable electric quantity of each cell by an equation I-I:

$$E_i^D = Q_i - \int_{T_{min}^C}^{T_i^C} I^C dt \quad \text{I-I}$$

wherein $E_i^D$ denotes the dischargeable electric quantity of each cell.

3. The method of claim 2, wherein the obtaining a real rated capacity and a real dischargeable electric quantity of each cell in the battery pack comprises:
obtaining an open circuit voltage of each cell in the battery pack;
obtaining a state of charge $SOC_i$ of each cell based upon the open circuit voltage obtained;
obtaining the initial rated capacity of each cell from the first data diagram as the real rated capacity of each cell; and
calculating the real dischargeable electric quantity of each cell based upon the state of charge $SOC_i$ and the initial rated capacity of each cell according to the following equation IV:

$$E_i^R = Q_i \times SOC_i \quad \text{IV}$$

wherein $E_i^R$ denotes the real dischargeable electric quantity of each cell.

4. The method of claim 1, wherein the first data diagram and the second data diagram are each a 2D graph based on a rectangular coordinate system, an x-axis in the first data diagram is the initial rated capacity, a y-axis in the first data diagram is the initial dischargeable electric quantity, an x-axis in the second data diagram is the real rated capacity, a y-axis in the second data diagram is the real dischargeable electric quantity, and a coordinate point of each cell in the 2D graph is drawn as a scattered dot.

5. The method of claim 4, wherein the key cells comprise a cell with a lowest chargeable electric quantity, a cell with a lowest dischargeable electric quantity, a cell with a lowest rated capacity, and a cell with a highest rated capacity in the battery pack;
the first information includes first locations of coordinate points of the key cells in the first data diagram, and first boundary lines of the initial cell distribution region are drawn based on the first locations; and
the second information includes second locations of coordinate points of the key cells in the second data diagram, and second boundary lines of the real cell distribution region are drawn based on the second locations.

6. The method of claim 5, wherein the first boundary lines and the second boundary lines each comprise a lowest rated capacity line, a highest rated capacity line, a charge isoline, and a discharge isoline;
the lowest rated capacity line passes the coordinate point of the cell with the lowest rated capacity and is perpendicular to the x-axis;
the highest rated capacity line passes the coordinate point of the cell with the highest rated capacity and is perpendicular to the x-axis;
the discharge isoline passes the coordinate point of the cell with the lowest dischargeable electric quantity and is in parallel with the x-axis;
the charge isoline passes the coordinate point of the cell with the lowest chargeable electric quantity and has about a 45° intersection angle with the x-axis.

7. The method of claim 6, wherein the initial cell distribution region and the real cell distribution region are each enclosed by the lowest rated capacity line, the highest rated capacity line, the charge isoline, and the discharge isoline.

8. The method of claim 6, wherein the initial cell distribution region and the real cell distribution region are each a trapezoid.

9. The method of claim 8, wherein the first area of the initial cell distribution region and the second area of the real cell distribution region are each calculated by an equation VI:

$$S = \frac{(Q_{max} + Q_{min} - 2 \times Q_{pack}) \times (Q_{max} - Q_{min})}{2}$$

wherein S denotes the first area or the second area, $Q_{max}$ denotes the highest rated capacity among the cells in the battery pack, $Q_{min}$ denotes the lowest rated capacity among the cells in the battery pack, and $Q_{pack}$ denotes an initial rated capacity of the battery pack.

10. The method of claim 9, wherein $Q_{pack}$ is 0 equal to an x-axis value of an intersection of the charge isoline and discharge isoline.

11. A strategy for balancing a battery pack, comprises:
obtaining an initial rated capacity and an initial dischargeable electric quantity of each cell in an unused battery pack after a charge and discharge cycle of the battery pack;
generating a first data diagram for every cells of the battery pack based upon the initial rated capacity and the initial dischargeable electric quantity of each cell;
after using the battery pack for a period of time, obtaining a real rated capacity and a real dischargeable electric quantity of each cell in the battery pack;
generating a second data diagram for every cells of the battery pack based upon the real rated capacity and the real dischargeable electric quantity of each cell;
obtaining a first information of key cells in the first data diagram;
defining an initial cell distribution region on the first data diagram according to the first information by processing the first data diagram;
calculating a first area of the initial cell distribution region;
obtaining a second information of the key cells in the second data diagram;
defining a real cell distribution region on the second data diagram according to the second information by processing the second data diagram;
calculating a second area of the real cell distribution region;
judging whether the second area of the real cell distribution region is consistent with the first area of the initial cell distribution region; and
when the second area of the real cell distribution region is not consistent with the first area of the initial cell distribution region, balancing the battery pack until the second area of the real cell distribution region is consistent with the first area of the initial cell distribution region;
wherein the judging whether the second area of the real cell distribution region is consistent with the first area of the initial cell distribution region comprises:
calculating a real difference between the second area of the real cell distribution region and the first area of the initial cell distribution region;
comparing the real difference with a preset difference threshold value between the second area of the real cell distribution region and the first area of the initial cell distribution region;
determining that the second area of the real cell distribution region is consistent with the first area of the initial cell distribution region if the real difference is equal to or smaller than the preset difference threshold value; and
determining that the second area of the real cell distribution region is not consistent with the first area of the initial cell distribution region if the real difference is larger than the preset difference threshold value.

12. The strategy of claim 11, wherein the first data diagram and the second data diagram are each a 2D graph based on a rectangular coordinate system, an x-axis in the first data diagram is the initial rated capacity, a y-axis in the first data diagram is the initial dischargeable electric quantity, an x-axis in the second data diagram is the real rated capacity, a y-axis in the second data diagram is the real dischargeable electric quantity, and a coordinate point of each cell in the 2D graph is drawn as a scattered dot.

13. The strategy of claim 12, wherein the key cells comprise a cell with a lowest chargeable electric quantity, a cell with a lowest dischargeable electric quantity, a cell with a lowest rated capacity, and a cell with a highest rated capacity in the battery pack;
the first information includes first locations of coordinate points of the key cells in the first data diagram, and first boundary lines of the initial cell distribution region are drawn based on the first locations; and
the second information includes second locations of coordinate points of the key cells in the second data diagram, and second boundary lines of the real cell distribution region are drawn based on the second locations.

14. The strategy of claim 13, wherein the first boundary lines and the second boundary lines each comprise a lowest rated capacity line, a highest rated capacity line, a charge isoline, and a discharge isoline;
the lowest rated capacity line passes the coordinate point of the cell with the lowest rated capacity and is perpendicular to the x-axis;
the highest rated capacity line passes the coordinate point of the cell with the highest rated capacity and is perpendicular to the x-axis;
the discharge isoline passes the coordinate point of the cell with the lowest dischargeable electric quantity and is in parallel with the x-axis;
the charge isoline passes the coordinate point of the cell with the lowest chargeable electric quantity and has about a 45° intersection angle with the x-axis; and
the initial cell distribution region and the real cell distribution region are each enclosed by the lowest rated capacity line, the highest rated capacity line, the charge isoline, and the discharge isoline.

15. The strategy of claim 14, wherein the initial cell distribution region and the real cell distribution region are each a trapezoid, the first area of the initial cell distribution region and the second area of the real cell distribution region are each calculated by an equation VI:

$$S = \frac{(Q_{max} + Q_{min} - 2 \times Q_{pack}) \times (Q_{max} - Q_{min})}{2}$$

wherein S denotes the first area or the second area, $Q_{max}$ denotes the highest rated capacity among the cells in the battery pack, $Q_{min}$ denotes the lowest rated capacity among the cells in the battery pack, and $Q_{pack}$ denotes an initial rated capacity of the battery pack;
$Q_{pack}$ is equal to an x-axis value of an intersection of the charge isoline and discharge isoline.

16. The strategy of claim 11, wherein the obtaining an initial rated capacity and an initial dischargeable electric quantity of each cell in the battery pack comprises:
charging the battery pack with a constant charge current $I^C$ from a zero time point;

recording a time point $T_i^C$ when a terminal voltage of each cell reaches to a voltage limit for charge until terminal voltages of all cells reach to the voltage limit for charge, wherein i denotes a reference number for each cell, and recording an earliest time point $T_i^C$ as $T_{min}^C$;

after terminal voltages of all cells reach to the voltage limit for charge, resting the battery pack for a preset time period;

after the preset time period, discharging the battery pack with a constant discharge current $I^D$, recording a time point $T_i^D$ when the terminal voltage of each cell reaches to a voltage limit for discharge until terminal voltages of all cells reach to the voltage limit for discharge, and recording an earliest time point $T_i^D$ as $T_{min}^D$;

calculating the initial rated capacity of each cell by an equation I:

$$Q_i = \int_{T_i^C}^{T_i^D} I^D dt \qquad \text{I}$$

wherein $Q_i$ denotes the rated capacity of each cell; and calculating the initial dischargeable electric quantity of each cell by an equation I-I:

$$E_i^D = Q_i - \int_{T_{min}^C}^{T_i^C} I^C dt \qquad \text{I-I}$$

wherein $E_i^D$ denotes the dischargeable electric quantity of each cell.

17. The strategy of claim 16, wherein the obtaining a real rated capacity and a real dischargeable electric quantity of each cell in the battery pack comprises:

obtaining an open circuit voltage of each cell in the battery pack;

obtaining a state of charge $SOC_i$ of each cell based upon the open circuit voltage obtained;

obtaining the initial rated capacity of each cell from the first data diagram as the real rated capacity of each cell; and calculating the real dischargeable electric quantity of each cell based upon the state of charge $SOC_i$ and the initial rated capacity of each cell according to the following equation IV:

$$E_i^R = Q_i \times SOC_i \qquad \text{IV};$$

wherein $E_i^R$ denotes the real dischargeable electric quantity of each cell.

* * * * *